(12) United States Patent
Tian et al.

(10) Patent No.: US 11,201,302 B2
(45) Date of Patent: Dec. 14, 2021

(54) FLEXIBLE DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN); Zheng Liu, Beijing (CN); Dong Li, Beijing (CN); Liangjian Li, Beijing (CN); Zunqing Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/759,846

(22) PCT Filed: Apr. 24, 2019

(86) PCT No.: PCT/CN2019/084057
§ 371 (c)(1),
(2) Date: Apr. 28, 2020

(87) PCT Pub. No.: WO2019/206178
PCT Pub. Date: Oct. 31, 2019

(65) Prior Publication Data
US 2020/0335712 A1 Oct. 22, 2020

(30) Foreign Application Priority Data

Apr. 28, 2018 (CN) .......................... 201810400601.X

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3244* (2013.01); *H01L 51/003* (2013.01);
(Continued)

(58) Field of Classification Search
None
See application file for complete search history.

(56) References Cited

U.S. PATENT DOCUMENTS

| 9,508,855 B2 | 11/2016 | Lee et al. | |
| 2006/0169989 A1* | 8/2006 | Bhattacharya | H01L 21/469 257/79 |

(Continued)

FOREIGN PATENT DOCUMENTS

| CN | 104518000 A | 4/2015 |
| CN | 106298798 A | 1/2017 |

(Continued)

OTHER PUBLICATIONS

Koo, Ja Hoon, et al. "Flexible and Stretchable Smart Display: Materials, Fabrication, Device Design, and System Integration." Advanced Functional Materials, vol. 28, No. 35, 2018, p. 1801834., doi:10.1002/adfm.201801834. (Year: 2018).*

(Continued)

*Primary Examiner* — J. E. Schoenholtz
(74) *Attorney, Agent, or Firm* — Myers Bigel, P.A.

(57) ABSTRACT

The embodiments of the disclosure provide a flexible display panel, including a flexible substrate, the flexible substrate including a plurality of cylindrical surface stretching bodies in an array, every two adjacent cylindrical surface stretching bodies being connected by their side edges, and a flexible device on the flexible substrate, the flexible device being conformal with the flexible substrate. The embodi-
(Continued)

ments also provide a display device including the flexible display panel and a method for manufacturing the flexible display panel.

16 Claims, 7 Drawing Sheets

(52) U.S. Cl.
CPC ........ *H01L 51/56* (2013.01); *H01L 2227/326* (2013.01); *H01L 2251/5338* (2013.01)

(56) References Cited

U.S. PATENT DOCUMENTS

| | | |
|---|---|---|
| 2015/0091005 A1 | 4/2015 | Park |
| 2015/0162377 A1 | 6/2015 | Lee et al. |
| 2016/0227623 A1* | 8/2016 | Yoo ..................... H01L 51/0097 |
| 2017/0194365 A1 | 7/2017 | Cai |
| 2019/0006633 A1 | 1/2019 | Wang et al. |
| 2019/0206903 A1* | 7/2019 | Kim ..................... H01L 27/1262 |

FOREIGN PATENT DOCUMENTS

| | | |
|---|---|---|
| CN | 106338852 A | 1/2017 |
| CN | 206388706 U | 8/2017 |
| CN | 108242424 A | 7/2018 |
| CN | 108389888 A | 8/2018 |

OTHER PUBLICATIONS

"First Office Action and English language translation", CN Application No. 201810400601.X, dated Dec. 4, 2019, 9 pp.
"International Search Report and English language translation", International Application No. PCT/CN2019/084057, dated Jul. 29, 2019, 8 pp.

* cited by examiner

FLEXIBLE DISPLAY PANEL, MANUFACTURING METHOD THEREOF AND DISPLAY DEVICE

RELATED APPLICATIONS

The present application is a 35 U.S.C. 371 national stage application of a PCT International Application No. PCT/CN2019/084057, filed on Apr. 24, 2019, which claims the benefits of priority of Chinese patent application No. 201810400601.X filed on Apr. 28, 2018, the entire disclosures of which are incorporated herein by reference.

TECHNICAL FIELD

This disclosure relates to the field of display technologies, and particularly to a flexible display panel, a manufacturing method thereof and a display device.

BACKGROUND

Organic light-emitting diode (OLED) display panels have gradually become the mainstream of the display field due to their characteristics of self-luminosity, lightness and thinness, wide angle of view, high brightness, high contrast and so on. The OLED display panel is widely applied in terminal products such as smart phones, tablet computers and televisions. In particular, flexible OLED display panels are bendable, and thus can be applied to terminal products with various special structures.

Typically, inorganic layers are often formed during the manufacture of a flexible OLED display panel. The flexible OLED display panel is flat before it is bent, when frequently bent or stretched, the inorganic layers are prone to crack or even break under stress, which will finally lead to declined quality of or even complete damage to the flexible display panel.

SUMMARY

In an aspect of the disclosure, a flexible display panel is provided, the flexible display panel comprising: a flexible substrate comprising a plurality of cylindrical surface stretching bodies in an array, every two adjacent cylindrical surface stretching bodies of the plurality of cylindrical surface stretching bodies being connected by side edges thereof; and a flexible device on the flexible substrate, the flexible device being conformal with the flexible substrate.

According to some embodiments, the flexible device comprises a plurality of display units, each display unit of the plurality of display units comprises at least one pixel, the plurality of display units are in one-to-one correspondence with the plurality of cylindrical surface stretching bodies. The plurality of display units are arranged on and conformal with corresponding ones of the cylindrical surface stretching bodies, and every two adjacent display units of the plurality of display units are electrically connected with each other.

According to some embodiments, a surface of each of the plurality of cylindrical surface stretching bodies in contact with the flexible device is convex.

According to some embodiments, a surface of each of the plurality of cylindrical surface stretching bodies in contact with the flexible device is concave.

According to some embodiments, each display unit of the plurality of display units comprises 2 to 12 pixels, and each of the pixels comprises at least two sub-pixels.

According to some embodiments, each display unit of the display units comprises: a buffer layer; and an active layer pattern, a gate insulating layer, a gate pattern, an insulating layer, a source-drain pattern, a planarization layer, a pixel layer, a pixel defining layer and a support layer stacked on the buffer layer sequentially.

In another aspect, a display device is proposed, which comprises the flexible display panel according to any of the foregoing embodiments.

Yet another embodiment of the disclosure provides a method for manufacturing a flexible display panel, comprising: forming a support, the support comprising a plurality of cylindrical surface supporting units in an array; forming a flexible substrate on the support, the flexible substrate being conformal with the support and comprising a plurality of cylindrical surface stretching bodies in an array, every two adjacent ones of the plurality of cylindrical surface stretching bodies being connected by side edges thereof, and the plurality of cylindrical surface stretching bodies being in one-to-one correspondence with the plurality of cylindrical surface supporting units; forming a flexible device on the support with the flexible substrate, the flexible device being conformal with the flexible substrate; and separating the support from the flexible substrate to obtain the flexible display panel.

According to some embodiments, the forming the support comprises: providing a base substrate; and forming a removable layer on the base substrate to serve as the support. The separating the support from the flexible substrate comprises: removing the removable layer on the base substrate; and separating the base substrate without the removable layer from the flexible substrate.

According to some embodiments, the flexible device comprises a plurality of display units, each display unit of the plurality of display units comprises at least one pixel. The forming the flexible device on the support with the flexible substrate comprises: forming the plurality of display units on the support with the flexible substrate, the plurality of display units being in one-to-one correspondence with the plurality of cylindrical surface stretching bodies, the plurality of display units being arranged on and conformal with corresponding ones of the cylindrical surface stretching bodies, and every two adjacent display units of the plurality of display units being electrically connected with each other.

According to some embodiments, the removable layer is made of a silicon dioxide material, the removing the removable layer on the base substrate comprises: spraying a silicon dioxide dissolving agent on the removable layer to remove the removable layer on the base substrate.

According to some embodiments, the removable layer is made of a UV degradable material.

According to some embodiments, the forming the plurality of display units on the support with the flexible substrate comprises: forming a buffer layer; and forming an active layer pattern, a gate insulating layer, a gate pattern, an insulating layer, a source-drain pattern, a planarization layer, a pixel layer, a pixel defining layer and a support layer sequentially on the buffer layer.

According to some embodiments, one or more of the buffer layer, the active layer pattern, the gate insulating layer, the gate pattern, the insulating layer, the source-drain pattern, the planarization layer, the pixel layer, the pixel defining layer and the support layer are made of an inorganic material.

According to some embodiments, the base substrate comprises a glass substrate.

BRIEF DESCRIPTION OF DRAWINGS

In order to illustrate the embodiments of this disclosure more clearly, drawings to be used in the description of the embodiments will be briefly introduced below. Apparently, the drawings in the description below are only some embodiments of this disclosure. For those having ordinary skills in the art, other drawings can be further obtained from these drawings without any inventive efforts.

The drawings here are incorporated into the specification to form part of the specification and show embodiments conforming to this disclosure, and are used to explain the principles of this disclosure together with the following description.

DETAILED DESCRIPTION OF EMBODIMENTS

In order to render the objects, the technical solutions and the advantages of this disclosure clearer, the disclosure will be further described in detail with reference to the drawings. Apparently, the described embodiments are only part of possible embodiments of this disclosure, rather than all of them. Based on the embodiments herein, other embodiments obtained by one having ordinary skills in the art without inventive efforts all fall within the protection scope of this disclosure.

Figure 1A:
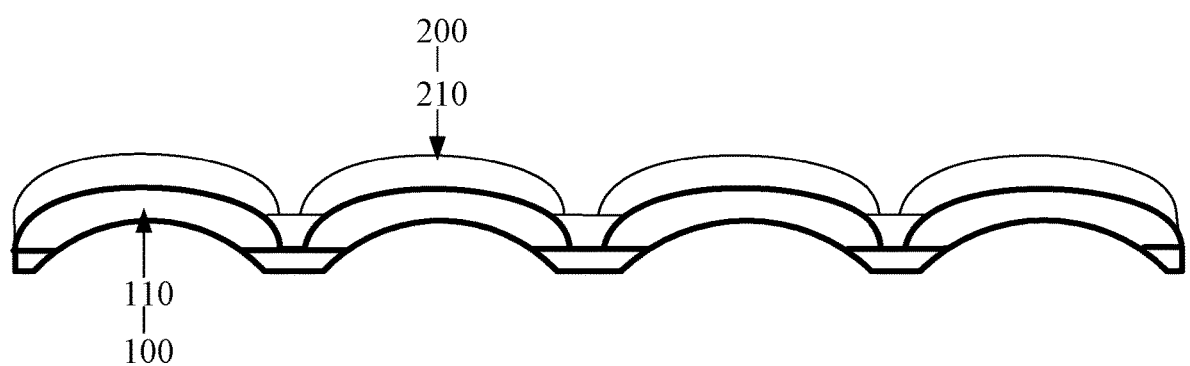
FIG. 1A is a schematic view of a flexible display panel according to an embodiment of this disclosure.

The embodiments of this disclosure provide a flexible display panel, which, as shown in FIG. 1A, comprises: a flexible substrate 100, the flexible substrate 100 comprising a plurality of cylindrical surface stretching bodies 110 arranged in an array, every two adjacent cylindrical surface stretching bodies 110 being connected by their side edges. A flexible device 200 is conformally arranged on the flexible substrate 100. FIG. 1A is a side view of the flexible display panel. FIG. 1C is a top view of the flexible display panel 100, and as shown in FIG. 1C, the plurality of cylindrical surface stretching bodies 110 are arranged in an array.

It should be noted that the term "conformally" or "conformal" mentioned herein means that when the flexible device is arranged on the flexible substrate, the flexible device and the flexible substrate have the same or similar superficial morphology.

Figure 2:
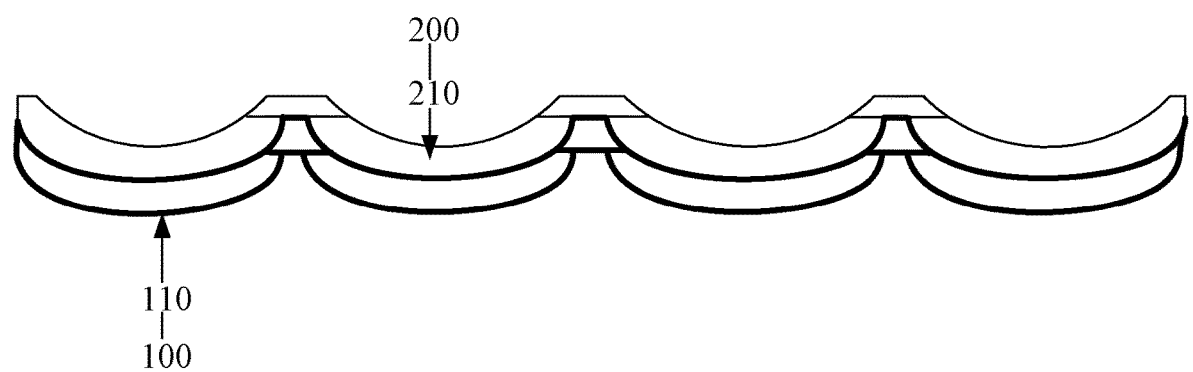
FIG. 2 is a schematic view of a flexible display panel according to another embodiment of this disclosure.

As used herein, the "cylindrical surface" stretching body may have a shape as shown in FIG. 1A or FIG. 2. As known by one skilled in the art, a cylindrical surface stretching body refers to a three-dimensional structure formed by a plane moving along a curve. Unlike a cylinder, a top surface of the cylindrical surface stretching body may be either convex or concave.

In related arts, in order to ensure the electric characteristics, a lot of inorganic layers will usually be formed when manufacturing a flexible display panel. The flexible display panel is of a planar structure before it is bent, when frequently bent or stretched subsequently, the inorganic layers are prone to crack or even break under stress, which will finally lead to declined quality of or even complete damage to the flexible display panel. Whereas for the embodiments of the disclosure, the flexible substrate comprises a plurality of cylindrical surface stretching bodies arranged in an array. In this way, the entire structure of the flexible display panel is a curved structure, such that when bent or stretched subsequently, the inorganic layers in the flexible display panel will not be prone to the influence of stress.

In the flexible display panel provided in the embodiments of this disclosure, the flexible substrate comprises a plurality of cylindrical surface stretching bodies arranged in an array, and a flexible device is arranged on the flexible substrate, the flexible device is conformal with the flexible substrate. Since the flexible display panel is of a curved structure on the whole, when bent or stretched subsequently, the inorganic layers are not prone to the influence of stress, which can improve the quality of the flexible display panel.

In an example embodiment, referring to FIG. 1A, the flexible device 200 may comprise a plurality of display units 210, each display unit 210 comprising at least one pixel, and the plurality of display units 210 are in one-to-one correspondence with the plurality of cylindrical surface stretching bodies 110, and every two adjacent display units 210 are electrically connected with each other. For example, the two display units may be electrically connected via metal wires. In particular, since the flexible device 200 is conformally arranged on the flexible substrate 100 with the cylindrical surface stretching bodies 110, each display unit 210 also is in a shape of a cylindrical surface.

As an example, referring to FIG. 1A, the flexible device 200 comprises four display units 210, and the flexible substrate 100 comprises four cylindrical surface stretching bodies 110, and the four display units 210 correspond to the four cylindrical surface stretching bodies 110 respectively, i.e., each cylindrical surface stretching body 110 is provided with one display unit 210.

It should be pointed out that the number of the display units and correspondingly the number of the cylindrical surface stretching bodies as well as the distance between two adjacent display units can be determined based on the product resolution. For example, when a low product resolution is required, the number of the display units can be small, and the distance between two adjacent display units can be relatively large. If a high product resolution is desired, the number of the display units can be great, and the distance between two adjacent display units can be small.

In an example embodiment, each display unit may comprise 2 to 12 pixels. Each pixel comprises at least two sub-pixels, e.g., each pixel may comprise a red sub-pixel, a blue sub-pixel, a green sub-pixel and so on.

In case each display unit comprises 2 to 12 pixels, the flexible display panel can have a better stretching effect, and the display panel can be implemented more easily.

Figure 1B:
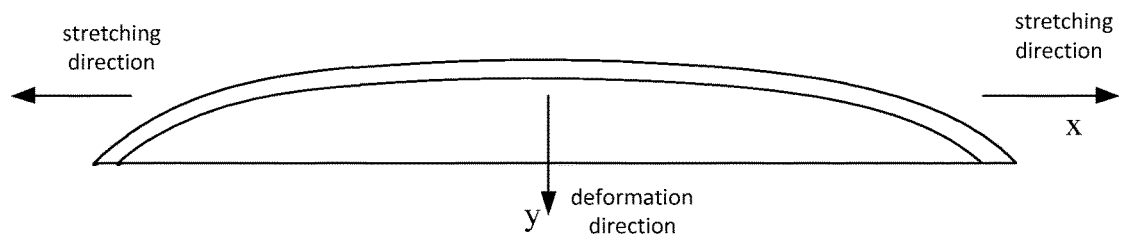
FIG. 1B is a schematic view of a display unit being stretched according to an embodiment of this disclosure.
Figure 1C:
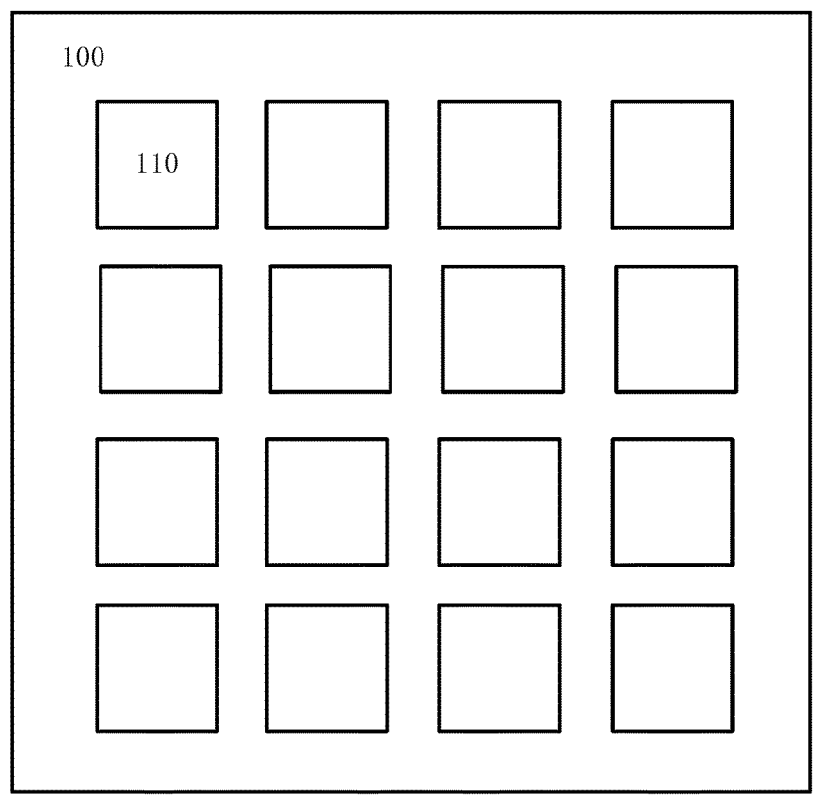
FIG. 1C is a top view of an arrangement of a plurality of cylindrical surface stretching bodies on a flexible display panel according to an embodiment of this disclosure.

FIG. 1B is a schematic view of a display unit comprising one pixel being stretched according to an embodiment of the disclosure. Referring to FIG. 1B, when the display unit is stretched in a horizontal direction (e.g., a direction indicated by x and a direction opposite thereto), the display unit will be deformed in a vertical direction (e.g., a direction indicated by y). As compared with a display unit of a planar structure, the display unit with a cylindrical surface structure in the embodiments of this disclosure has room for stretching, so it has better resistance to stretching.

It should be noted that in the embodiments of this disclosure, a surface of the cylindrical surface stretching body 110 of the flexible substrate in contact with the flexible device may be either convex or concave. When the surface of the cylindrical surface stretching body 110 in contact with the flexible device is convex, the schematic structure view of the flexible display panel according to the embodiments of this disclosure is as shown in FIG. 1A, where the plurality of display units 210 are in one-to-one correspondence with the plurality of cylindrical surface stretching bodies 110, and each cylindrical surface stretching body 110 has the same shape as a corresponding display unit 210, and the surface of the cylindrical surface stretching body 110 in contact with the flexible device is convex. Alternatively, when a surface of the cylindrical surface stretching body 110 in contact with the flexible device is concave, the schematic structure view of the flexible display panel according to the embodiments of this disclosure may be as shown in FIG. 2. A plurality of display units 210 are arranged on the flexible substrate 100 of FIG. 2, and the plurality of display units 210 correspond to the plurality of cylindrical surface stretching bodies 110 respectively. Each cylindrical surface stretching body 110 has the same shape as a corresponding display unit 210, and the surface of the cylindrical surface body 110 in contact with the flexible device is concave.

In an example embodiment, the flexible display panel provided in the embodiments of the disclosure can be a flexible OLED display panel, e.g., a flexible active-matrix organic light emitting diode (AMOLED) display panel. To take a flexible AMOLED display panel as an example, referring to FIG. 3, each display unit 210 in FIG. 1A or FIG. 2 may comprise a buffer layer 211. An active layer pattern 212, a gate insulating layer 213, a gate pattern 214, an insulating layer 215, a source-drain pattern 216, a planarization layer 217, a pixel layer 218, a pixel defining layer 219 and a support layer 220 are arranged on the buffer layer 211 sequentially. The active layer pattern can be formed of a poly-silicon (P-Si) film.

In encapsulation of the flexible display panel provided in the embodiments of this disclosure, e.g., a thin film encapsulation (TFE) process may be used, thereby obtaining a pre-stretched panel as desired.

Figure 3:
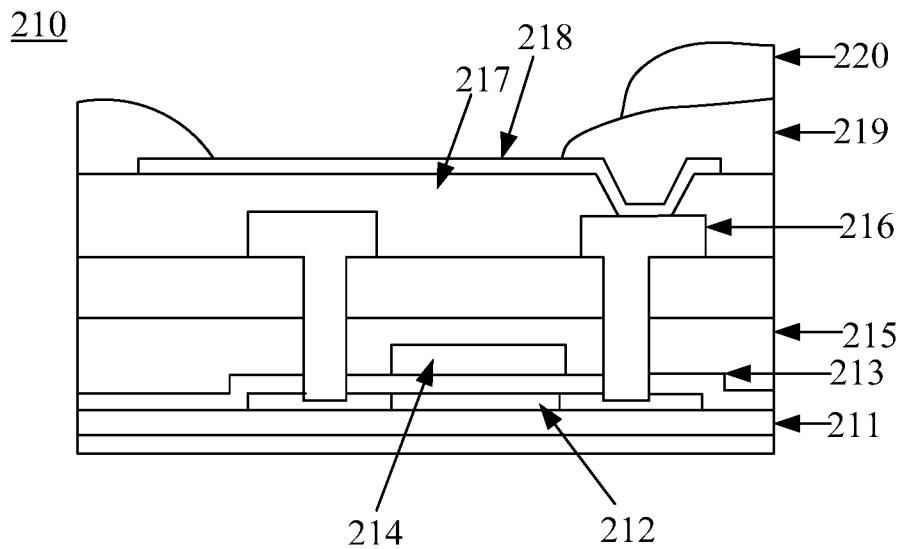
FIG. 3 is a schematic view of a display unit.

It should be pointed out that although the display unit 210 is shown as having a planar structure in FIG. 3, this is only for facilitating illustration. When the display unit 210 is arranged on the flexible substrate 100, as shown in FIGS. 1A and 2, the display unit 210 is conformally arranged on the corresponding cylindrical surface stretching body 110, and presents a cylindrical surface shape.

With the flexible display panel provided in the embodiments of this disclosure, the degree of wire deformation and the degree of layer deformation can be reduced when the flexible device is stretched, which improves the resistance of the flexible device (e.g., the pixel region and the wire region) to deformation, and thus improves the reliability and the yield of the product. Meanwhile, since the flexible substrate comprises a plurality of cylindrical surface stretching bodies arranged in an array, when the flexible display panel is stretched, the change in the light emitting area is small. Therefore, in case the flexible display panel is stretched, the brightness variation of the flexible display panel is slight, which will not affect the normal display of the flexible display panel; when it is seriously stretched, the amount of brightness to be compensated will not be too much.

In the flexible display panel provided in the embodiments herein, the flexible substrate comprises a plurality of cylindrical surface stretching bodies arranged in an array, every two adjacent cylindrical surface stretching bodies being connected by their side edges, and a flexible device is conformally arranged on the flexible substrate, and thus the flexible display panel is of a curved structure as a whole, when bent or stretched subsequently, the inorganic layers are not prone to the influence of stress, which can improve the quality of the flexible display panel.

As used herein, the term "inorganic layer" may refer to a layer in the display unit 210 made of an inorganic material and having a weak tensile strength, e.g., one or more of the buffer layer 211, the active layer pattern 212, the gate insulating layer 213, the gate pattern 214, the insulating layer 215, the source-drain pattern 216, the pixel layer 218, the pixel defining layer 219 and the support layer 220.

Another embodiment of this disclosure provides a display device, comprising the above flexible display panel, and the flexible display panel can be shown in FIG. 1A or FIG. 2.

Figure 4:
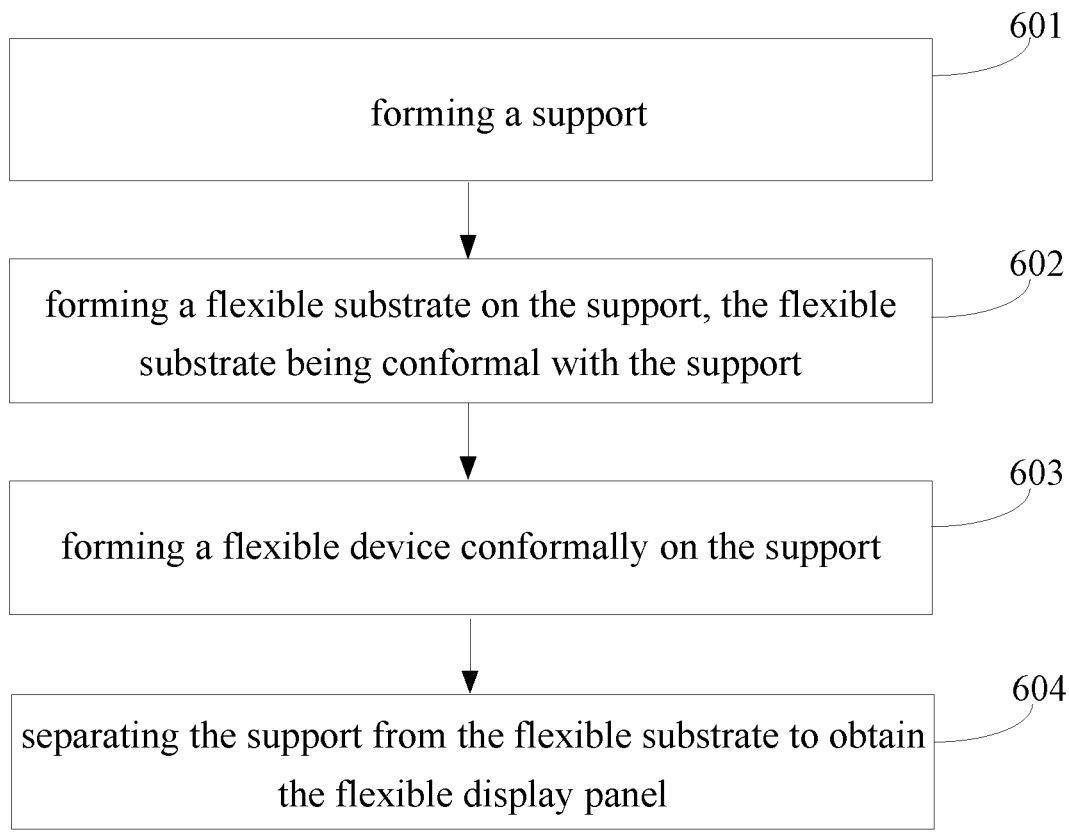
FIG. 4 is a flow chart showing a method for manufacturing a flexible display panel according to an embodiment of this disclosure.

FIG. 4 is a flow chart of a method for manufacturing a flexible display panel according to an embodiment of this disclosure. Referring to FIG. 4, in step 601, a support is formed.

Figure 5:
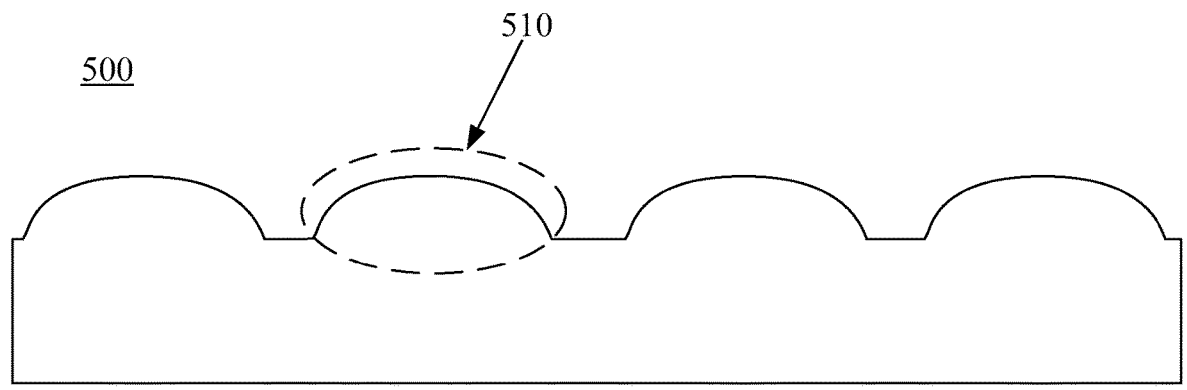
FIG. 5 is a schematic view of a support according to an embodiment of this disclosure.

As an example, referring to FIG. 5, the support 500 comprises a plurality of supporting units 510 arranged in an array. FIG. 5 is a side view of the support 500.

Next, in step 602, a flexible substrate is formed conformally on the support.

The term "conformally" here means that when the flexible substrate is formed on the support, the support and the flexible substrate have the same or similar superficial morphology.

Figure 6:
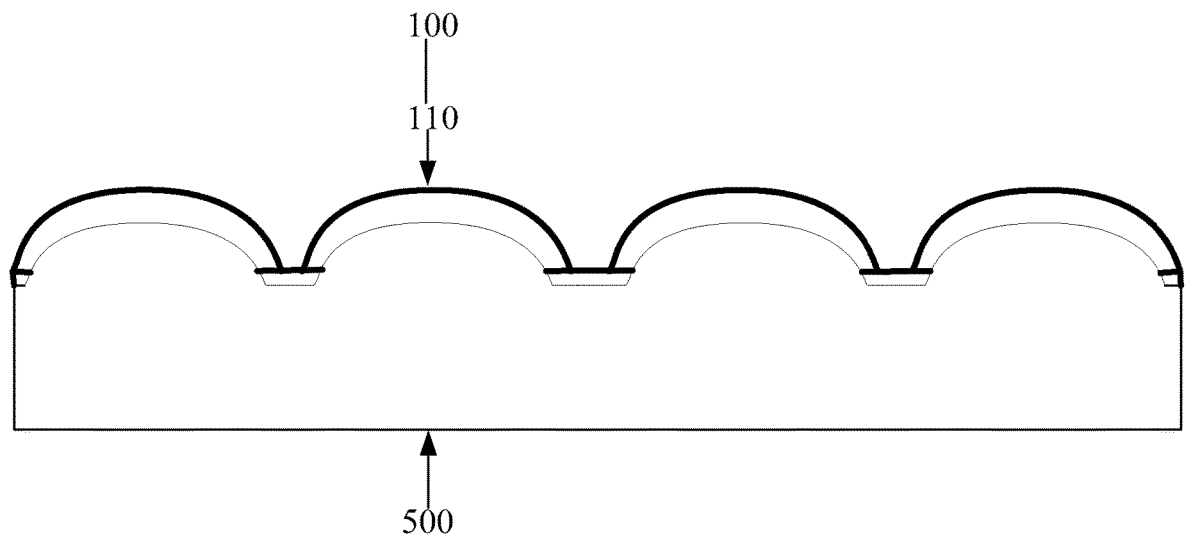
FIG. 6 is a schematic view of a flexible substrate according to an embodiment of this disclosure.

As an example, referring to FIG. 6, a flexible substrate 100 is formed conformally on the support 500, and a surface of each supporting unit in contact with the flexible substrate 100 can be either concave or convex. FIG. 6 illustrates an example in which the surface of each supporting unit in contact with the flexible substrate 100 is convex.

Referring to FIG. 6, the flexible substrate 100 comprises a plurality of cylindrical surface stretching bodies 110 arranged in an array, every two adjacent cylindrical surface stretching bodies 110 being connected by their side edges. The plurality of cylindrical surface stretching bodies 110 correspond to the plurality of supporting units 510 respectively.

In step 603, a flexible device is formed conformally on the support with the flexible substrate.

The term "conformally" here means that when the flexible device is formed on the flexible substrate, the flexible device and the flexible substrate have the same or similar superficial morphology.

Figure 7:
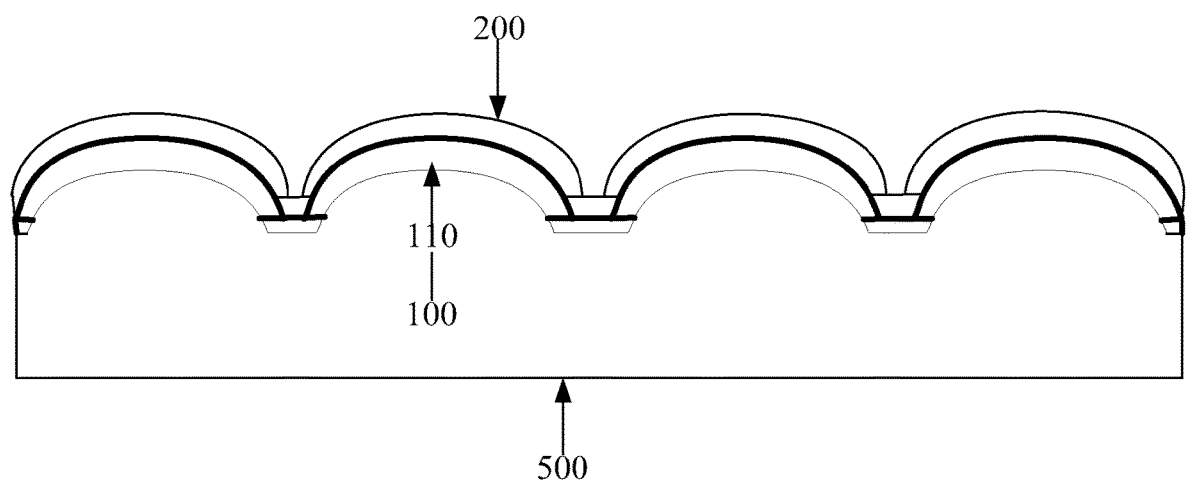
FIG. 7 is a schematic view of a flexible device according to an embodiment of this disclosure.

As an example, referring to FIG. 7, a flexible device 200 is formed conformally on the support 500 with the flexible substrate 100.

It is noted that in this step, the entire flexible device can be formed directly on the flexible substrate by using the flexible substrate on the support as a supporting base. Alternatively, in a further embodiment, the flexible device can be formed on a further supporting base, and then the formed flexible device is transferred to the support with the flexible substrate according to the embodiments of this disclosure.

In step 604, the support is separated from the flexible substrate with the flexible device to obtain the flexible display panel.

For example, the support 500 of FIG. 7 is separated from the flexible substrate 100 with the flexible device 200 to obtain the flexible display panel, as shown in FIG. 1A.

In this embodiment, FIG. 5 to FIG. 7 illustrate side views in which the surface of the supporting unit in contact with the flexible substrate is convex.

In encapsulation of the flexible display panel provided in the embodiments of this disclosure, e.g., a TFE process can be used, thereby obtaining a pre-stretched panel as desired.

In the method for manufacturing a flexible display panel according to the embodiments of this disclosure, firstly, a flexible substrate is formed conformally on a support, and then a flexible device is formed conformally on the support with the flexible substrate, and then the support is separated from the flexible substrate with the flexible device, and thereby a flexible display panel is obtained. The flexible substrate comprises a plurality of cylindrical surface stretching bodies arranged in an array, and the entire structure of the flexible display panel is a curved structure, so when bent or stretched subsequently, the inorganic layers will not be prone to the influence of stress, which can improve the quality of the flexible display panel.

Figure 8:
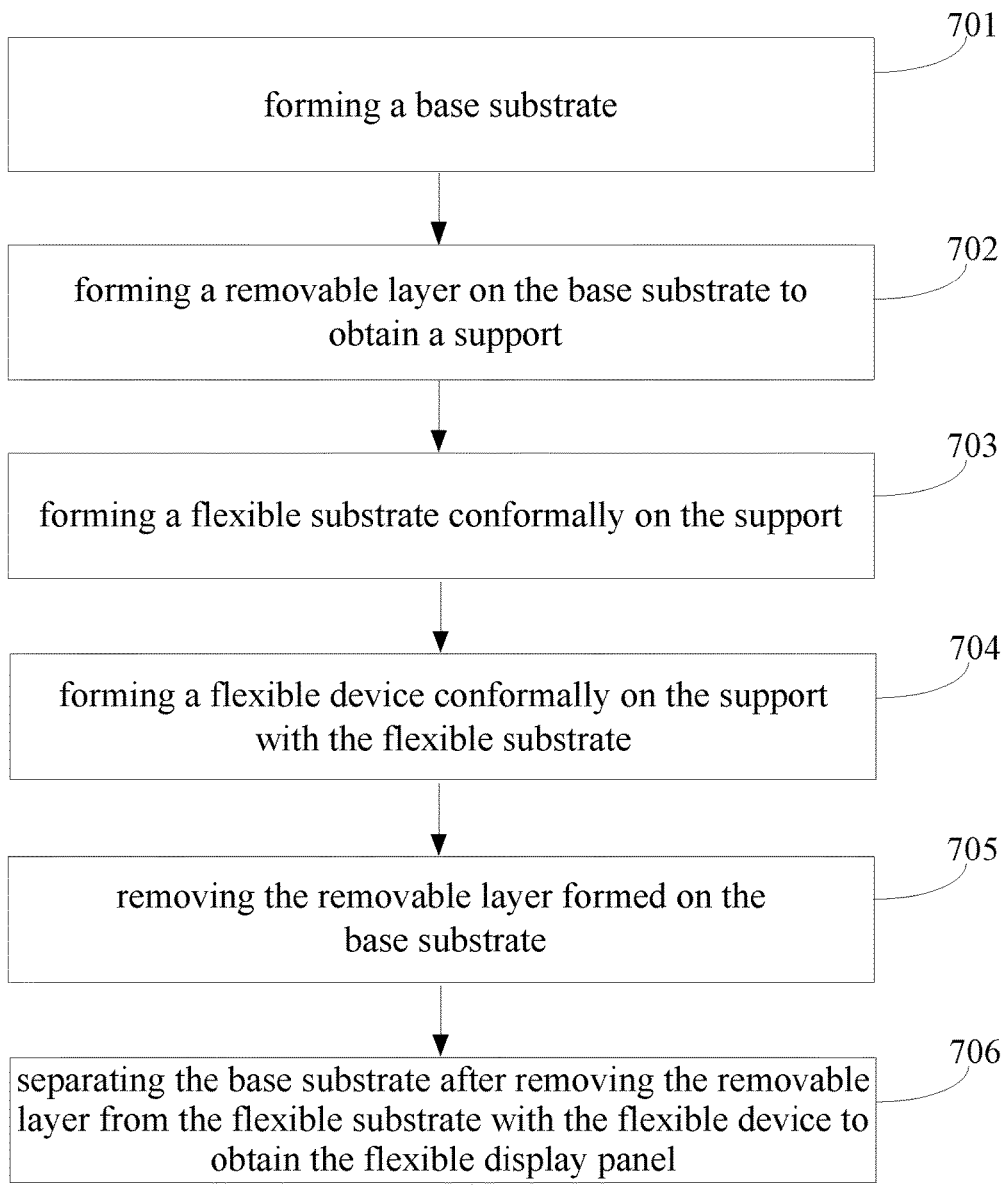
FIG. 8 is a flow chart showing a method for manufacturing a flexible display panel according to another embodiment of this disclosure.
Figure 9:
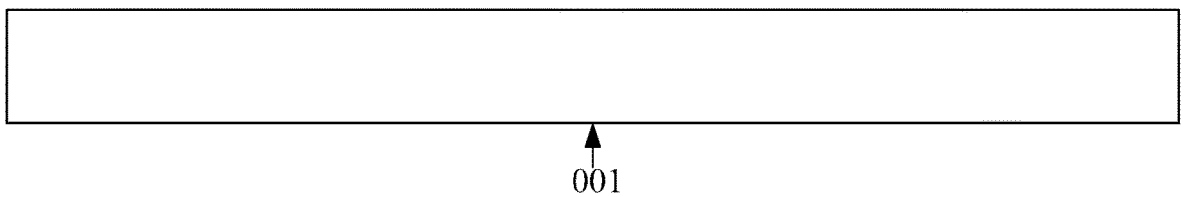
FIG. 9 is a schematic view of a base substrate according to an embodiment of this disclosure.

In the flexible display panel manufactured by using the method for manufacturing a flexible display panel according to the embodiments of this disclosure, a surface of the cylindrical surface stretching body in contact with the flexible device can be either convex or concave. The method for manufacturing a flexible display panel will be explained below by taking the surface of the cylindrical surface stretching body in contact with the flexible device being convex as an example. Referring to FIG. 8, for this manufacturing method, in step 701, a base substrate is provided. For example, referring to FIG. 9, a base substrate 001 is provided. In particular, the base substrate may be a glass substrate. Besides, the base substrate may also be other substrates having a certain rigidity, and the type of the base substrate will not be limited herein.

Next, in step 702, a removable layer is formed on the base substrate to obtain a support.

Figure 10:
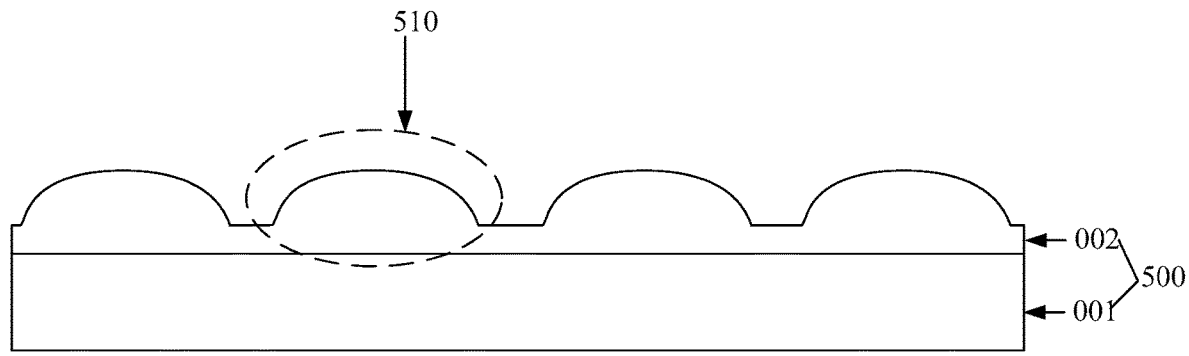
FIG. 10 is a schematic view of a removable layer according to an embodiment of this disclosure.

For example, referring to FIG. 10, a removable layer 002 is formed on the base substrate 001 to obtain a support 500.

In an example embodiment, a silicon dioxide material can be coated on the base substrate 001 to form the removable layer 002.

Alternatively, the removable layer may also be made of other materials such as silicon nitrides (SiNx), molybdenum oxides and so on, or other materials degradable under specific UV irradiation.

Apart from by coating, the removable layer may also be formed by deposition, and the material of the removable layer and the way it is formed will not be limited in the embodiments of this disclosure.

In particular, as shown in FIG. 10, the removable layer 002 comprises a plurality of supporting units 510 arranged in an array.

In step 703, a flexible substrate is formed conformally on the support.

Figure 11:
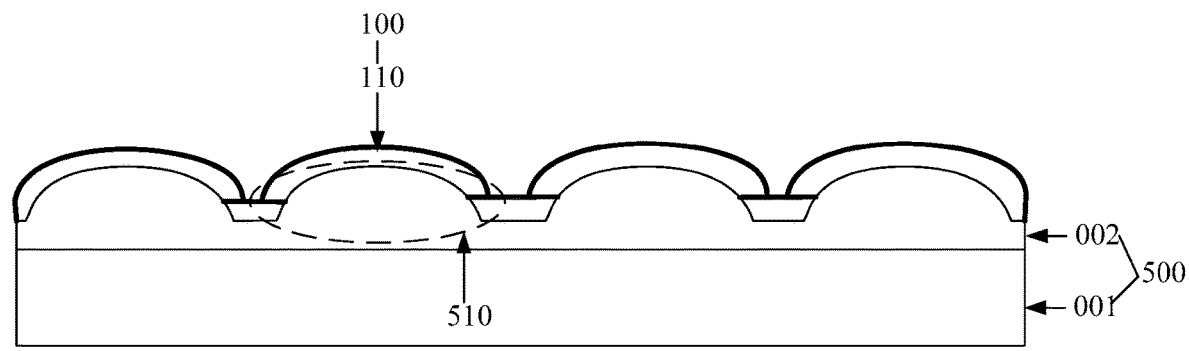
FIG. 11 is a schematic view of a flexible substrate according to an embodiment of this disclosure.

For example, referring to FIG. 11, a flexible substrate 100 is formed conformally on the support 500. A surface of the supporting unit 510 in contact with the flexible substrate 100 is convex, and the flexible substrate 100 comprises a plurality of cylindrical surface stretching bodies 110 arranged in an array, every two adjacent cylindrical surface stretching bodies 110 being connected by their side edges, and the plurality of cylindrical surface stretching bodies 110 are in one-to-one correspondence with the plurality of supporting units 510.

In step 704, a flexible device is formed conformally on the support with the flexible substrate.

Figure 12:
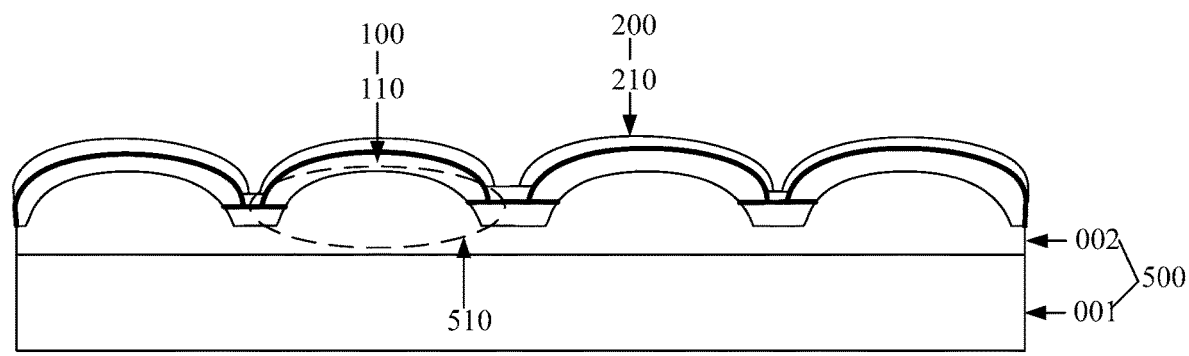
FIG. 12 is a schematic view of a flexible device according to an embodiment of this disclosure.

For example, referring to FIG. 12, a flexible device 200 is formed conformally on the support 500 with the flexible substrate 100. A surface of the cylindrical surface stretching body 110 in contact with the flexible device 200 is convex.

In an example embodiment, referring to FIG. 12, the flexible device 200 comprises a plurality of display units 210, and each display unit 210 comprises at least one pixel. Correspondingly, step 704 may comprise: forming a plurality of display units 210 on the support 500 with the flexible substrate 100, where the plurality of display units 210 correspond to the plurality of cylindrical surface stretching bodies 110 respectively, and two adjacent display units 210 are electrically connected with each other. For example, the two display units may be electrically connected via metal wires.

As an example, referring to FIG. 12, a surface of the display unit 210 facing away the flexible substrate 100 is convex. The display unit is a cylindrical surface structure so as to facilitate subsequent bending or stretching of the flexible display panel.

Optionally, the number of the display units and the distance between two adjacent display units can be determined based on the product resolution. For example, when the desired product resolution is not high, there can be less display units, and the distance between two adjacent display units can be great; when the product resolution is required to be high, there can be more display units, and the distance between two adjacent display units can be small.

To take a flexible AMOLED display panel as an example, in the embodiments of this disclosure, referring to FIG. 3, forming each display unit comprises: forming a buffer layer 211; and forming an active layer pattern 212, a gate insulating layer 213, a gate pattern 214, an insulating layer 215, a source-drain pattern 216, a planarization layer 217, a pixel layer 218, a pixel defining layer 219 and a support layer 220 sequentially on the buffer layer 211.

In an example embodiment, each display unit can comprise 2 to 12 pixels. Each pixel comprises at least two sub-pixels, e.g., each pixel may comprise a red sub-pixel, a blue sub-pixel, a green sub-pixel and so on.

When the display unit comprises 2 to 12 pixels, the flexible display panel may have a better stretching effect, and the display panel can be implemented more easily.

In step 705, the removable layer formed on the base substrate is removed.

In this step, when removing the removable layer, a material capable of reacting with the removable layer but incapable of reacting with the base substrate can be selected. The selected material is coated on the removable layer such that it reacts with the removable layer under a specified condition, thereby removing the removable layer. For example, the specified condition may be a lighting condition of a target wavelength, or a condition of a preset period. The way of removing the removable layer will not be limited in the embodiments of this disclosure.

In an example embodiment, the removable layer is made of a silicon dioxide material. Correspondingly, step 705 may comprise: spraying a silicon dioxide dissolving agent on the removable layer so as to remove the removable layer formed on the base substrate.

Specifically, a silicon dioxide dissolving agent can be sprayed on the removable layer 002 shown in FIG. 12 so as to remove the removable layer 002 formed on the base substrate 001.

Alternatively, the removable layer may also be made of other materials such as silicon nitrides (SiNx), molybdenum (Mo) oxides and so on, or other materials degradable under specific UV irradiation. In practice, a corresponding way of removing the removable layer can be selected according to the material of the removable layer.

In step 706, the base substrate after removing the removable layer is separated from the flexible substrate with the flexible device to obtain the flexible display panel.

For example, the flexible display panel comprising the flexible substrate separated from the base substrate through removal of the removable layer and having the flexible device formed thereon may be shown in FIG. 1A.

Besides, in a further embodiment of the disclosure, the base substrate may also be separated from the flexible substrate with the flexible device without executing step 705, i.e., without removing the removable layer formed on the base substrate. For example, when the removable layer is made of a silicon nitride or silicon dioxide material, the base substrate may also be separated from the flexible substrate with the flexible device by application of an external force.

Furthermore, the method for manufacturing a flexible display panel provided in the embodiments of the disclosure may further comprise: encapsulating the flexible display panel obtained in step 706 by using a TFE process, thereby obtaining a pre-stretched panel as desired.

To sum up, for the method for manufacturing a flexible display panel according to the embodiments of the disclosure, a flexible substrate is firstly formed conformally on a support, and then a flexible device is formed conformally on the support with the flexible substrate, and then the support is separated from the flexible substrate with the flexible device, and thereby a flexible display panel is obtained. The flexible substrate comprises a plurality of cylindrical surface stretching bodies arranged in an array, and the surface of the cylindrical surface stretching body in contact with the flexible device is convex, and the flexible display panel is a convex structure as a whole. In this way, when bent or stretched subsequently, the inorganic layers in the flexible display panel are not prone to the influence of stress, which can improve the quality of the flexible display panel.

In a still another embodiment of the disclosure, when the surface of the cylindrical surface stretching body in contact with the flexible device is concave, the method for manufacturing a flexible display panel may comprise the following steps.

Firstly, a base substrate is provided. The base substrate can be a glass substrate.

Next, a removable layer is formed on the base substrate to obtain a support. For example, a silicon dioxide material layer can be coated on the base substrate to form the removable layer. The removable layer comprises a plurality of supporting units arranged in an array.

Then, a flexible substrate is formed conformally on the support. A surface of the supporting unit in contact with the flexible substrate is concave, and the flexible substrate comprises a plurality of cylindrical surface stretching bodies arranged in an array, every two adjacent cylindrical surface stretching bodies being connected by their side edges, and the plurality of cylindrical surface stretching bodies are in one-to-one correspondence with the plurality of supporting units.

Next, a flexible device is formed conformally on the support with the flexible substrate. A surface of the cylindrical surface stretching body in contact with the flexible device is concave.

Optionally, the flexible device comprises a plurality of display units, each of the display units comprising at least one pixel. Correspondingly, the step may comprise: forming a plurality of display units on the support with the flexible substrate, the plurality of display units correspond to the plurality of cylindrical surface stretching bodies respectively, and two adjacent display units are electrically connected with each other. For example, the two display units are electrically connected via metal wires. Each display unit may comprise 2 to 12 pixels. Each pixel comprises at least two sub-pixels, e.g., each pixel may comprise a red sub-pixel, a blue sub-pixel, a green sub-pixel and so on.

In the above embodiments, the surface of the display unit facing away the flexible substrate is concave. The display unit is of a cylindrical surface structure so as to facilitate subsequent bending or stretching of the flexible display panel.

Then, the removable layer formed on the base substrate is removed. For example, the removable layer is made of a silicon dioxide material, so a silicon dioxide dissolving agent can be sprayed on the removable layer so as to remove the removable layer formed on the base substrate.

Finally, the base substrate without the removable layer is separated from the flexible substrate with the flexible device to obtain the flexible display panel. The obtained flexible display panel may be shown in FIG. 2.

For the specific procedure of the method steps for manufacturing a flexible display panel according to the above embodiments of this disclosure, the above step 701 to step 706 can be referred to.

Furthermore, in the embodiments of this disclosure, the method for manufacturing a flexible display panel may further comprise encapsulating the resultant flexible display panel by using a TFE process, thereby obtaining a pre-stretched panel as desired.

To sum up, for the method for manufacturing a flexible display panel according to the embodiments of this disclosure, firstly, a flexible substrate is formed conformally on a support, and then a flexible device is formed conformally on the support with the flexible substrate, and then the support is separated from the flexible substrate with the flexible device, and thereby a flexible display panel is obtained. The flexible substrate comprises a plurality of cylindrical surface stretching bodies arranged in an array, and a surface of the cylindrical surface stretching body in contact with the flexible device is concave. Since the flexible display panel is of a concave structure as a whole, when bent or stretched subsequently, the inorganic layers are not prone to the influence of stress, which can improve the quality of the flexible display panel.

When considering the specification and implementing the solution of the disclosure, one skilled in the art can easily conceive of other embodiments. The present application is intended to cover any variation, usage or adaptive change of this disclosure, which comply with the general principles of this disclosure and include common knowledge or conventional technical measures unmentioned herein. It is intended that the description and the embodiments should be considered as examples only, with the true scope and spirit of the disclosure being indicated by the claims.

It should be understood that this disclosure is not limited to the accurate structures described above and shown in the drawings, but instead various modifications and changes can be made without departing from the disclosure. The scope of this disclosure is only limited by the appended claims.

The invention claimed is:

1. A flexible display panel, comprising:
a flexible substrate comprising a plurality of cylindrical surface stretching bodies in an array, wherein pairs of adjacent cylindrical surface stretching bodies of the plurality of cylindrical surface stretching bodies are connected to each other by side edges thereof; and
a flexible device on the flexible substrate,
wherein the flexible device is conformal with the flexible substrate,
wherein the flexible device comprises a plurality of display units,
wherein each display unit of the plurality of display units comprises at least one pixel,
wherein the plurality of display units are in one-to-one correspondence with the plurality of cylindrical surface stretching bodies,
wherein the plurality of display units are on and conformal with corresponding ones of the plurality of cylindrical surface stretching bodies, and
wherein adjacent display units of the plurality of display units are electrically connected with each other,
wherein each display unit of the plurality of display units comprises 2 to 12 pixels, and
wherein each of the at least one pixel comprises at least two sub-pixels.

2. The flexible display panel according to claim 1, wherein a respective surface of each of the plurality of cylindrical surface stretching bodies in contact with the flexible device is convex.

3. The flexible display panel according to claim 1, wherein a respective surface of each of the plurality of cylindrical surface stretching bodies in contact with the flexible device is concave.

4. The flexible display panel according to claim 1, wherein each display unit of the display units comprises:
a buffer layer; and
an active layer pattern, a gate insulating layer, a gate pattern, an insulating layer, a source-drain pattern, a planarization layer, a pixel layer, a pixel defining layer and a support layer stacked on the buffer layer sequentially.

5. A display device, comprising the flexible display panel according to claim 1.

6. A method for manufacturing a flexible display panel, comprising:
forming a support comprising a plurality of cylindrical surface supporting units in an array;
forming a flexible substrate on the support, wherein the flexible substrate is conformal with the support and comprises a plurality of cylindrical surface stretching bodies in an array, wherein pairs of adjacent ones of the plurality of cylindrical surface stretching bodies are connected to each other by side edges thereof, and wherein the plurality of cylindrical surface stretching bodies are in one-to-one correspondence with the plurality of cylindrical surface supporting units;
forming a flexible device on the support and the flexible substrate, wherein the flexible device is conformal with the flexible substrate; and
separating the support from the flexible substrate to obtain the flexible display panel.

7. The method according to claim 6, wherein the forming the support comprises:
providing a base substrate; and
forming a removable layer on the base substrate to serve as the support,
wherein the separating the support from the flexible substrate comprises:
removing the removable layer on the base substrate; and
separating the base substrate without the removable layer from the flexible substrate.

8. The method according to claim 6, wherein the flexible device comprises a plurality of display units, wherein each display unit of the plurality of display units comprises at least one pixel, and wherein the forming the flexible device on the support with the flexible substrate comprises:
forming the plurality of display units on the support with the flexible substrate, wherein the plurality of display units are in one-to-one correspondence with the plurality of cylindrical surface stretching bodies, wherein the plurality of display units are on and conformal with corresponding ones of the plurality of cylindrical surface stretching bodies, and wherein adjacent display units of the plurality of display units are electrically connected with each other.

9. The method according to claim 7,
wherein the removable layer comprises a silicon dioxide material, and
wherein the removing the removable layer on the base substrate comprises spraying a silicon dioxide dissolving agent on the removable layer to remove the removable layer on the base substrate.

10. The method according to claim 7, wherein the removable layer comprises a UV degradable material.

11. The method according to claim 8, wherein the forming the plurality of display units on the support with the flexible substrate comprises:
forming a buffer layer; and
forming an active layer pattern, a gate insulating layer, a gate pattern, an insulating layer, a source-drain pattern, a planarization layer, a pixel layer, a pixel defining layer and a support layer sequentially on the buffer layer.

12. The method according to claim 11, wherein one or more of the buffer layer, the active layer pattern, the gate insulating layer, the gate pattern, the insulating layer, the source-drain pattern, the planarization layer, the pixel layer, the pixel defining layer and the support layer comprise an inorganic material.

13. The method according to claim 7, wherein the base substrate comprises a glass substrate.

14. The display device according to claim 5, wherein a respective surface of each of the plurality of cylindrical surface stretching bodies in contact with the flexible device is convex.

15. The display device according to claim 5, wherein a respective surface of each of the plurality of cylindrical surface stretching bodies in contact with the flexible device is concave.

16. The display device according to claim 5, wherein each display unit of the display units comprises:
   a buffer layer; and
   an active layer pattern, a gate insulating layer, a gate pattern, an insulating layer, a source-drain pattern, a planarization layer, a pixel layer, a pixel defining layer and a support layer stacked on the buffer layer sequentially.

* * * * *